(12) United States Patent
Kim et al.

(10) Patent No.: US 8,674,596 B2
(45) Date of Patent: Mar. 18, 2014

(54) ORGANIC LIGHT EMITTING DISPLAY DEVICE AND FABRICATION METHOD FOR THE SAME

(75) Inventors: Hyo-jin Kim, Suwon-si (KR); Dong-won Han, Suwon-si (KR)

(73) Assignee: Samsung Display Co., Ltd., Yogin, Gyeonggi-do (KR)

(*) Notice: Subject to any disclaimer, the term of this patent is extended or adjusted under 35 U.S.C. 154(b) by 75 days.

(21) Appl. No.: 12/135,951

(22) Filed: Jun. 9, 2008

(65) Prior Publication Data

US 2008/0309226 A1 Dec. 18, 2008

(30) Foreign Application Priority Data

Jun. 13, 2007 (KR) .................. 10-2007-0057904

(51) Int. Cl.
*H01L 51/50* (2006.01)
*H01J 9/02* (2006.01)

(52) U.S. Cl.
USPC ................... 313/504; 313/505; 313/506

(58) Field of Classification Search
USPC ............... 313/495–512; 315/169.3–169.4; 257/40, 79; 428/690; 345/30, 36, 44, 345/45; 252/72, 181.1, 194
See application file for complete search history.

(56) References Cited

U.S. PATENT DOCUMENTS

| | | | | |
|---|---|---|---|---|
| 5,757,126 A | * | 5/1998 | Harvey et al. | 313/506 |
| 2003/0038590 A1 | * | 2/2003 | Silvernail et al. | 313/504 |
| 2003/0164681 A1 | * | 9/2003 | Fukuoka et al. | 313/512 |
| 2003/0190763 A1 | * | 10/2003 | Cok et al. | 438/22 |

FOREIGN PATENT DOCUMENTS

| | | |
|---|---|---|
| JP | 2003-297559 | 10/2003 |
| KR | 1020050122904 | 12/2005 |
| KR | 1020060010093 | 2/2006 |
| KR | 1020060065393 | 6/2006 |
| KR | 10-0646933 | 9/2006 |
| KR | 1020060101817 | 9/2006 |
| KR | 10-2007-0047406 A | 7/2007 |

OTHER PUBLICATIONS

Notice of Allowance from priority No. KR 10-2007-0057904 dated Oct. 22, 2008.
Office Action dated Jun. 8, 2010 in related Japanese Patent Application No. 2007-242934.
Office Action issued Apr. 3, 2012 in related Japanese Patent Application No. 2007-242934, which claims priority of the corresponding Korean priority application No. 10-2007-0057904.

* cited by examiner

*Primary Examiner* — Anh Mai
*Assistant Examiner* — Elmito Breval
(74) *Attorney, Agent, or Firm* — Knobbe, Martens. Olson & Bear LLP

(57) ABSTRACT

An organic light emitting display device includes a substrate having a pixel region in which at least one organic light emitting diode is formed and a non-pixel region other than the pixel region; and an encapsulation film for encapsulating the substrate. Here, the encapsulation film is made of by laminating at least one organic film and at least inorganic film and a desiccant formed in at least one of the organic film and the inorganic film corresponding to the non-pixel region of the substrate.

13 Claims, 4 Drawing Sheets

US 8,674,596 B2

ORGANIC LIGHT EMITTING DISPLAY DEVICE AND FABRICATION METHOD FOR THE SAME

CROSS-REFERENCE TO RELATED APPLICATIONS

This application claims the benefit of Korean Patent Application No. 10-2007-0057904, filed on Jun. 13, 2007, in the Korean Intellectual Property Office, the disclosure of which is incorporated herein by reference.

BACKGROUND

1. Technical Field

The present disclosure relates to an organic light emitting display device and a method of fabricating the same, and more particularly, to an organic light emitting display device containing desiccants and a method of fabricating the same.

2. Discussion of Related Art

An organic light emitting display device is an emissive display in which an electrically excited fluorescent compound emits light. The organic light emitting display device is being developed as a next generation display because of a low driving voltage, thinness, a wide viewing angle, and a rapid response.

However, an emission layer of an organic light emitting diode is damaged by exposure to moisture and oxygen. Accordingly, in order to prevent the organic light emitting diode from being damaged by moisture and oxygen, an encapsulation device is provided on a substrate on which the organic light emitting display device is formed. The encapsulation device includes an encapsulation substrate or an encapsulation film. In smaller and thinner devices, the encapsulation device is typically an encapsulation film.

SUMMARY OF THE INVENTION

Accordingly, some aspects provide an organic light emitting display device comprising desiccants at a side of an encapsulation film to protect an organic light emitting display device and a method of fabricating the same. The objects and/or other aspects will be described in the description of certain preferred embodiments and the following claims.

The foregoing and/or other aspects are achieved by providing an organic light emitting display device including: a substrate including a pixel region in which at least one organic light emitting device is formed and a non-pixel region other than the pixel region; and an encapsulation film for encapsulating the substrate. Here, the encapsulation film includes a desiccant made by laminating at least one organic film and at least one inorganic film and formed in at least one of the organic film and the inorganic film corresponding to the non-pixel region of the substrate.

Preferably, the desiccant may be formed at a side of the organic film corresponding to the non-pixel region, or at a side of the inorganic film corresponding to the non-pixel region. The desiccants may be a material selected from the group consisting of alkali metal oxides, alkali earth metal oxides, metal halides, lithium sulfate, metal sulfates, metal perchlorates, and phosphorus pentoxide.

The encapsulation film is made by laminating at least four film layers comprising organic films and inorganic films, and the uppermost layer for forming the encapsulation film is made of the inorganic film, the organic film has a smaller area than a forming area of the inorganic film, and a thickness of the encapsulation film is from about 0.5 µm to about 10 µm.

The organic film of the encapsulation film comprises a material selected from the group of epoxy, acrylate, and urethane acrylate; and the inorganic film of the encapsulation film comprises a material selected from the group of $SiN_x$, $SiO_2$, $SiO_xN_y$, $AlO_xN_y$, $Al_xO_y$, and $Si_xO_y$.

The organic light emitting display device further includes a passivation film formed between the substrate on which the organic light emitting diode and the encapsulation film are disposed. The passivation film may be an inorganic film, comprising a material selected from the group of inorganic substance—such as LiF, $SiO_2$, $Si_xN_y$, and $Al_2O_3$, an oxide, and a nitride—and an organic substance. The desiccant may be formed between the passivation film corresponding to the non-pixel region and the encapsulation film.

Another aspect is achieved by providing a method of fabricating an organic light emitting display device including: providing a substrate on which a pixel region containing an organic light emitting diode and a non-pixel region other than the pixel region; and forming an encapsulation film in which at least one organic film and at least one inorganic film are sequentially formed. Here, the method further includes forming a desiccant in at least one of the organic film and the inorganic film that corresponds to the non-pixel region of the substrate.

Preferably, the desiccant may be one selected from a group of alkali metal oxides, alkali earth metal oxides, metal halides, lithium sulfate, metal sulfates, metal perchlorates, and phosphorus pentoxide. The method further comprises forming a desiccant in at least one of the organic film and the inorganic film that correspond to the non-pixel region of the substrate. The desiccant is formed by deposition or a screen printing, or the mask used in the deposition or the screen printing may be an edge open mask.

Some embodiments provide an organic light emitting display device comprising: a substrate comprising a pixel region and a non-pixel region; at least one organic light emitting diode disposed in the pixel region; an encapsulation film comprising at least one organic film and one inorganic film, and encapsulating the organic light emitting diode; and a desiccant made disposed in at least one of the organic film and the inorganic film in a region corresponding to the non-pixel region of the substrate.

In some embodiments, the desiccant is disposed in the organic film. In some embodiments, the desiccant is disposed in the inorganic film. In some embodiments, the desiccant is disposed between the organic film and the inorganic film. In some embodiments, the desiccant comprises at least one of alkali metal oxides, alkali earth metal oxides, metal halides, lithium sulfate, metal sulfates, metal perchlorates, and phosphorus pentoxide.

In some embodiments, the encapsulation film comprises at least two layers of the organic film and at least two layers of the inorganic film laminated together. In some embodiments, the inorganic film is an uppermost layer of the encapsulation film. In some embodiments, an area of the organic film is smaller than an area of the inorganic film and edges of the inorganic layer extend past edges of the organic layer.

In some embodiments, a thickness of the encapsulation film is from about 0.5 µm to about 10 µm. In some embodiments, the organic film of the encapsulation film comprises at least one of epoxy, acrylate, and urethane acrylate. In some embodiments, the inorganic film of the encapsulation film comprises at least one of $SiN_x$, $SiO_2$, $SiO_xN_y$, $AlO_xN_y$, $Al_xO_y$, and $Si_xO_y$.

Some embodiments further comprises a passivation film disposed between the organic light emitting diode and the encapsulation film. In some embodiments, the desiccant is disposed between the passivation film and the encapsulation film. In some embodiments, the passivation film comprises an inorganic film. In some embodiments, the passivation film comprises at least one of an inorganic substance, LiF, $SiO_2$, $Si_xN_y$, $Al_2O_3$, an oxide, a nitride, and an organic substance.

Some embodiments provide a method of fabricating an organic light emitting display device comprising: providing a substrate comprising a pixel region, a non-pixel region, and an organic light emitting diode disposed on the pixel region; forming an encapsulation film comprising sequentially forming at least one organic film and at least one inorganic film; and forming a desiccant in at least one of the organic film and the inorganic film in a region corresponding to the non-pixel region of the substrate.

In some embodiments, forming the desiccant comprises forming at least one of alkali metal oxides, alkali earth metal oxides, metal halides, lithium sulfate, metal sulfates, metal perchlorates, and phosphorus pentoxide.

Some embodiments further comprise forming a passivation film between the organic light emitting diode and the encapsulation film.

In some embodiments, forming the desiccant comprises at least one of depositing and screen printing the desiccant. In some embodiments, at least one of depositing and screen printing the desiccant comprises using an open edge mask.

BRIEF DESCRIPTION OF THE DRAWINGS

These and/or other embodiments and features will become apparent and more readily appreciated from the following description of certain exemplary embodiments, taken in conjunction with the accompanying drawings of which.

DETAILED DESCRIPTION OF CERTAIN EXEMPLARY EMBODIMENTS

Figure 1:
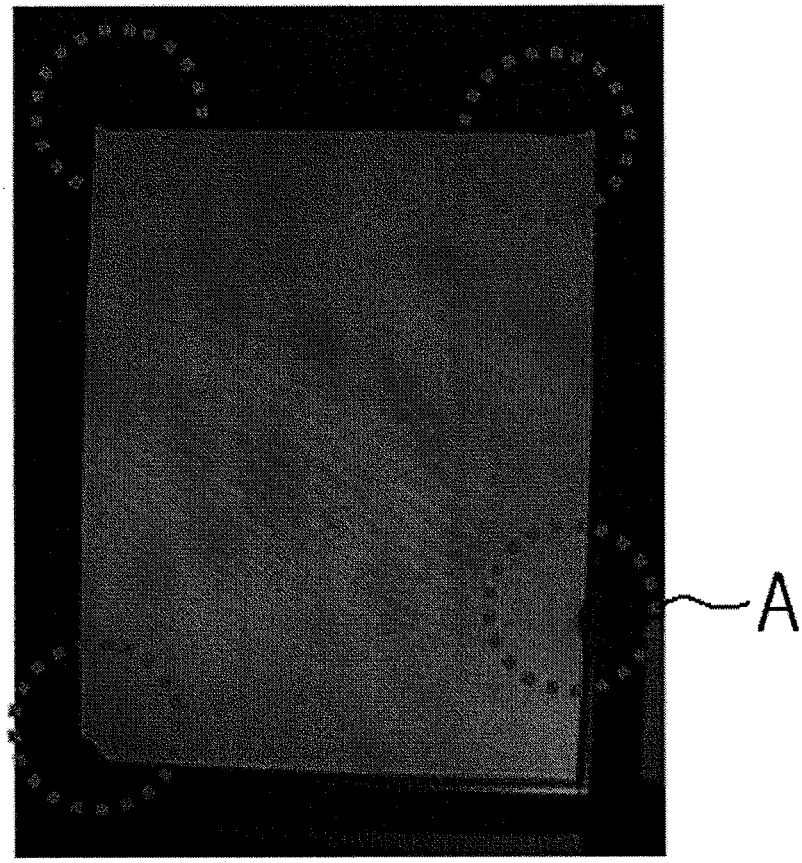
FIG. 1 is a top view illustrating an organic light emitting display device employing an encapsulation film.

Hereinafter, certain exemplary embodiments will be described with reference to the accompanying drawings. Here, when a first element is described as being coupled to a second element, the first element may be not only directly coupled to the second element but may also be indirectly coupled to the second element via one or more third elements. Further, elements that are not essential to a complete understanding are omitted for clarity. Also, like reference numerals refer to like elements throughout.

An encapsulation film typically comprises at least four alternating inorganic and organic films, with a total thickness of from about 0.5 µm to about 10 µm. For example, in some embodiments, the encapsulation film comprises a first organic film, a first inorganic film, a second organic film, and a second inorganic film, alternately laminated. As such, as organic light emitting display device employing an encapsulation film comprising inorganic films and organic films can be made thin.

However, since the outer regions of the encapsulation film are typically weaker than the central region of the encapsulation film, oxygen and moisture permeate the film, thereby damaging the emission layer of the organic light emitting display device. FIG. 1 illustrates pixel shrinkage at the outer corners A of the organic light emitting display device caused thereby.

Figure 2:
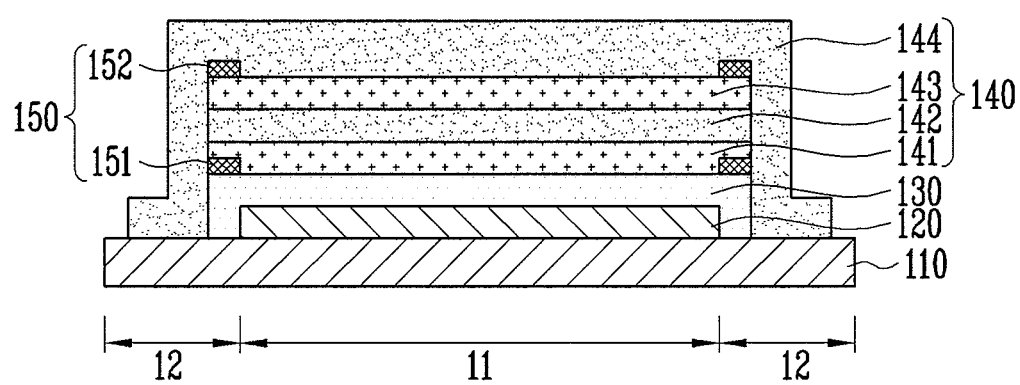
FIG. 2 is a cross-sectional view illustrating an organic light emitting display device according to a first embodiment.
Figure 3:
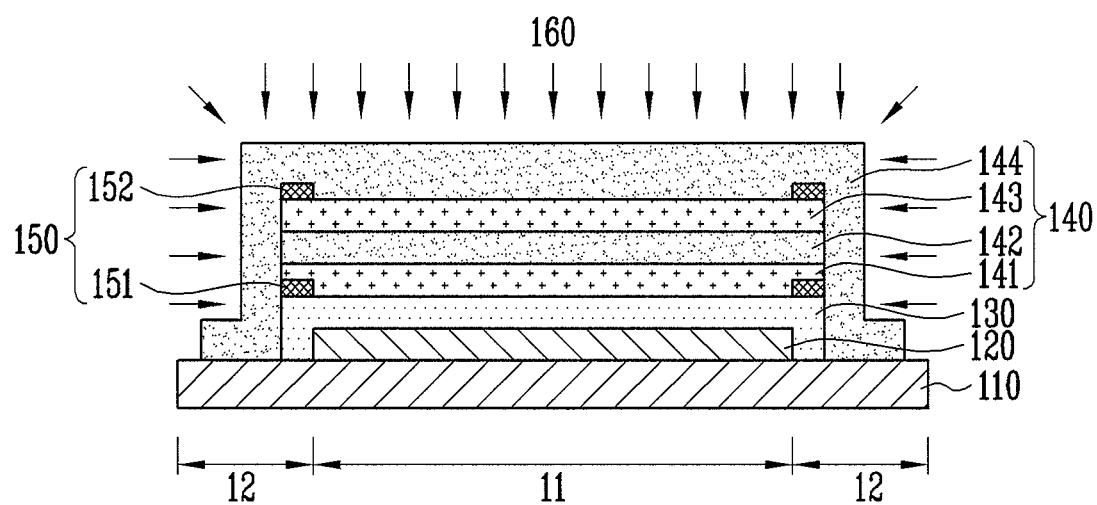
FIG. 3 is a cross-sectional view illustrating moisture permeation paths of the organic light emitting display device according to the first embodiment.

FIG. 2 is a cross-sectional view illustrating an organic light emitting display device 100 according to a first embodiment, and FIG. 3 is a cross-sectional view illustrating a moisture permeation path of the organic light emitting display device 100 according to the first embodiment. Referring to FIGS. 2 and 3, the organic light emitting display device 100 includes a substrate 110 having a pixel region 11, in which at least one organic light emitting diode (OLED) 120 is formed, and at least one non-pixel region 12 other than the pixel region 11; a passivation film 130 planarizing or flattening a step between the substrate 110 and the OLED 120 is formed; and an encapsulation film 140 encapsulating the substrate 110. Here, the encapsulation film 140 comprises at least one organic film and one inorganic film laminated together. A desiccant 150 is disposed in a region of at least one layer of the encapsulation film 140 corresponding to the non-pixel region 12.

On the substrate 110, the pixel region 11 comprises at least one thin film transistor electrically coupled to the OLED 120. The non-pixel region 12 comprises a driving circuit and a pad unit.

The pixel region 11 comprises at least one scan line and one data line, their intersections forming a matrix. The OLED 120 is coupled with the scan line to form a pixel. The non-pixel region 12 comprises a scan line and a data line extended from the scan line and the data line, respectively, of the pixel region 11; a source voltage supply line for driving the OLED 120; and a driving circuit for processing an external signal supplied through a pad unit and for supplying the processed signal to the scan line and the data line, that is, a driving unit and a data driving unit. The driving circuit may be mounted on a flexible printed circuit board (FPCB) electrically coupled with a unit display panel via the pad unit, or on the display panel in the form of an integrated circuit (IC) chip.

Moreover, the passivation film 130 is formed on the substrate 110 on which the OLED 120 is formed. The passivation film 130 covers the portion of the substrate on which the OLED 120 is formed. The passivation film 130 planarizes or flattens a contact surface between the substrate 110, on which the OLED 120 is formed, and the encapsulation film 140 to improve adhesion between the substrate 110 and the encapsulation film 140, thereby protecting the OLED 120 from external agents. The passivation film 130 comprises any suitable material, including inorganic and/or organic substances. Suitable inorganic substances include LiF, $SiO_2$, $Si_xN_y$, $Al_2O_3$, oxides, nitrides, and the like.

The encapsulation film 140 is formed on the passivation film 130. The encapsulation film 140 is formed by alternately laminating at least one organic film and at least one inorganic film in order to prevent moisture and oxygen from permeating. The overall thickness of the encapsulation film is from about 0.5 µm to about 10 µm, which is thinner than typical glass encapsulation substrates or metal encapsulation substrate, which are generally at least about 200 µm thick.

The uppermost layer of the encapsulation film 140 comprises an inorganic film, thereby increasing scratch resistance, or an anti-scratch property. Moreover, the organic film of the encapsulation film 140 is formed a over a smaller area than the inorganic film, the edges of which extend past the edges of the organic film such that the organic film is not exposed to the external environment, thereby protecting the organic film.

In the illustrated embodiment, the encapsulation film 140 includes a first organic film 141, a first inorganic film 142, and a second organic film 143, which are alternately laminated on the passivation film 130, and a second inorganic film 144 formed over the second organic film 143, and over the sides of the passivation film 130, the first organic film 141, the first inorganic film 142, and the second organic film 143.

The first and second organic films 141 and 143 of the encapsulation film 140 are believed to prevent nano-crack and micro-crack defects formed in the first and second inorganic films 142 and 144 from propagating, thereby blocking moisture and oxygen permeation pathways, as well as relieving stress remaining in the first and second inorganic films 142 and 144. Moreover, the first and second inorganic films 142 and 144 can prevent moisture and oxygen from permeating.

Also, the first and second organic films 141 and 143 may independently comprise a material selected from the group of epoxy, acrylate, and urethane acrylate; and the first and second inorganic films 142 and 144 may independently comprise a material selected from the group of $SiN_x$, $SiO_2$, $SiO_xN_y$, $AlO_xN_y$, $Al_xO_y$, and $Si_xO_y$.

On the other hand, in at least one layer of the encapsulation film 140, at least one desiccant 150 is formed to intercept oxygen and moisture that permeates the encapsulation film 140 from exterior, for example, in the first organic film 141 and the second inorganic film 144 in the illustrated embodiment. The desiccant 150 is disposed in a region of the encapsulation film 140 corresponding to the non-pixel region 12 of the substrate 110 to prevent interference with the light emitted from the organic light emitting diode 120. The desiccant 150 comprises a material selected from the group of alkali metal oxides, alkali earth metal oxides, metal halides, lithium sulfate, metal sulfates, metal perchlorates, and phosphorus pentoxide. The desiccant 150 may include a first desiccant 151 formed between the passivation film 130 and the first organic film 141, and a second desiccant 152 formed between the second organic film 143 and the second inorganic film 144.

The desiccant 150 may be formed between at least two layers in the encapsulation film 140 to intercept oxygen and moisture that permeates the encapsulation film 140. In other words, the desiccant 150 is formed in an outer region of the encapsulation film 140 to intercept, as illustrated in FIG. 3, oxygen and moisture that permeates the outer circumference of the encapsulation film 140. Accordingly, the organic light emitting diode 120 formed on the substrate 110 is protected, thereby increasing the quality of the organic light emitting display device 100.

Figure 4A:
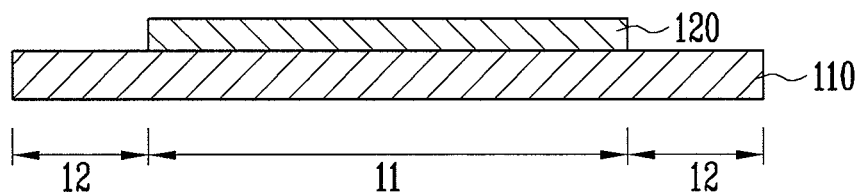
FIGS. 4A-4C are cross-sectional views illustrating an intermediate structure in a method for fabricating the organic light emitting display device according to the first embodiment.
Figure 4B:
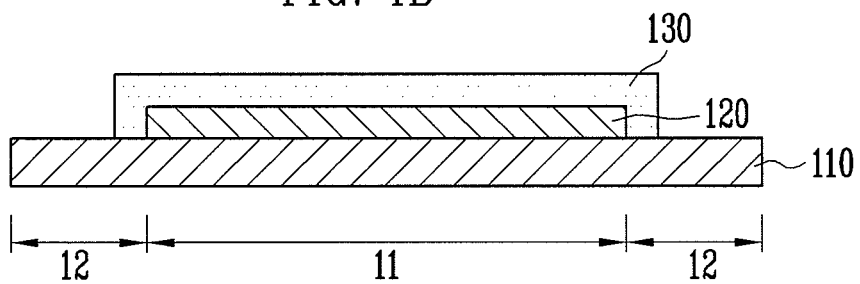
Figure 4C:
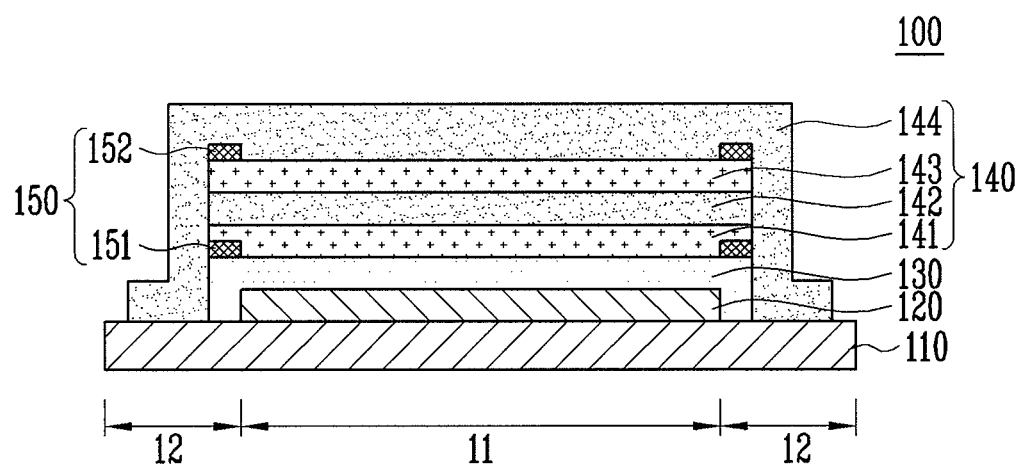

FIGS. 4A to 4C are cross-sectional views illustrating intermediate structures in a method for fabricating the organic light emitting display device according to the first embodiment. Referring to FIG. 4A, at least one thin film transistor and an organic light emitting diode 120 electrically coupled with the thin film transistor are formed in the pixel region 11 of the substrate 110. The driving circuit and the pad unit (not illustrated) are formed in the non-pixel region 12 of the substrate 110.

Referring to FIG. 4B, the passivation film 130 is formed over the OLED 120. The passivation film 130 may be formed of an inorganic substance and may planarize or flatten a step between the substrate 110 and the OLED 120. The first desiccant 151 is formed on a region of the passivation film 130 corresponding to the non-pixel region 12 of the substrate 110.

Referring to FIG. 4C, on the passivation film 130 in which the first desiccant 151 is formed, the first organic film 141, the first inorganic film 142, and the second organic film 143 are sequentially formed.

Moreover, in a region of the second organic film 143 corresponding to the non-pixel region 12, the second desiccant 152 is formed. These first and second desiccants 151 and 152 may be made by depositing and/or screen printing a material selected from the group of alkali metal oxides, alkali earth metal oxides, metal halides, lithium sulfate, metal sulfates, metal perchlorates, and phosphorus pentoxide. In embodiments in which the desiccant 150 is formed by deposition and/or screen printing, the desiccant 150 may be formed by cleaning the upper surfaces of the passivation film 130 and the second organic film 143 on which the desiccant 150 is formed, then using an edge open mask that exposes only the outer circumference of the encapsulation film 140 corresponding to the non-pixel region 12 of the substrate 110. Moreover, after coating the desiccant 150, the desiccant 150 is compressed and is hardened. As such, the desiccant 150 is formed in the outer region of the encapsulation film 140, that is, in the outer region of the encapsulation film 140, which external moisture and oxygen first contact, to protect the OLED 120.

The second inorganic film 144 surrounds the upper side of the second organic film 143 on which the second desiccant 152 is formed, and the sides of the first organic film 141, the first inorganic film 142, and the second organic film 143, thereby increasing adhesion between the substrate 110 and the encapsulation film 140. Moreover, the second inorganic film 144 is formed on the sides of the first and second organic films 141 and 143 and on the side of the first inorganic film 142 to block external oxygen and moisture from permeating the respective outer edges. The encapsulation film 140 may be formed by ion beam assisted sputtering, e-beam deposition, plasma enhanced chemical vapor deposition (PECVD), RF sputtering, or atomic layer deposition.

Figure 5:
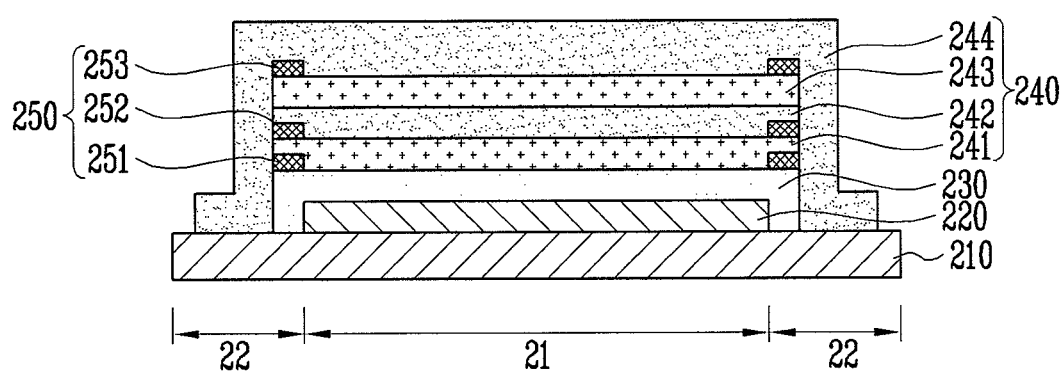
FIG. 5 is a cross-sectional view illustrating an organic light emitting display device according to a second embodiment.

FIG. 5 is a cross-sectional view illustrating an organic light emitting display device 200 according to a second embodiment. Referring to FIG. 5, an organic light emitting display device 200 includes a substrate 210 having a pixel region 21 in which at least one organic light emitting diode (OLED) 220 is formed and at least one non-pixel region 22 other than the pixel region 21; a passivation film 230 for planarizing or flattening a step between the substrate 210 and the OLED 220 is formed; and an encapsulation film 240 encapsulating the OLED 220. Here, the encapsulation film 240 comprises at least one organic film and one inorganic film laminated together, and a desiccant 250 disposed in at least one layer of the encapsulation film 240 in a region corresponding to the non-pixel region 22.

The OLED 220 according to the second embodiment is substantially identical to the OLED 120 according to the first embodiment. A first desiccant 251, a second desiccant 252, and a third desiccant 253 are sequentially formed on a passivation film 230, a first organic film 241, and a second organic film 243, respectively.

As such, the desiccant 250 is formed on the passivation film 230, the first organic film 241, and the second organic film 243, all in regions corresponding to the non-pixel region 22, thereby effectively intercepting moisture and oxygen that permeates the encapsulation film 240.

Figure 6:
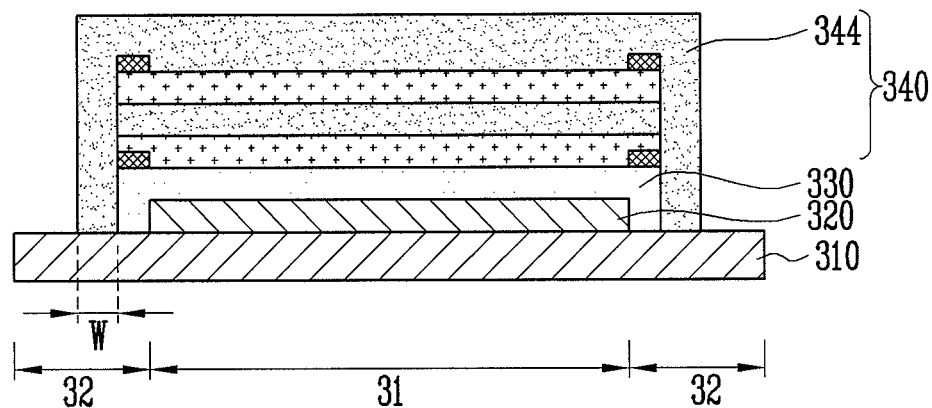
FIG. 6 is a cross-sectional view illustrating an organic light emitting display device according to a third embodiment.

FIG. 6 is a cross-sectional view illustrating an organic light emitting display device 300 according to a third embodiment. Referring to FIG. 6, the organic light emitting display device 300 includes a substrate 310 having a pixel region 31, in which at least one organic light emitting diode (OLED) 320 is formed, and at least one non-pixel region 32 other than the pixel region 21; a passivation film 330 planarizing or flattening a step between the substrate 310 and the OLED 320; and an encapsulation film 340 encapsulating the substrate 310. Here, the encapsulation film 340 comprises at least one organic film and one inorganic film laminated together and at a desiccant formed on at least one layer of the encapsulation film 340 in a region corresponding to the non-pixel region 32 of the substrate 310.

The OLED 320 according to the third embodiment is substantially identical to the OLED 120 according to the first embodiment A width W of the second inorganic film 344 where it contacts the substrate 310 around the passivation film 330 is less than the width of the corresponding inorganic film 244 depicted in FIG. 2. Accordingly, a dead space of the substrate 310 is reduced.

While certain embodiments have been shown and described herein, it will be apparent that the encapsulation film can also be applied to liquid crystal displays (LCD), field emission displays (FED), plasma display panels (PDP), electroluminescent displays (ELD), and s vacuum fluorescent displays (VFD).

According to some embodiments, a desiccant is formed in at least one layer of an encapsulation film in a region corresponding to a non-pixel region of a substrate to intercept oxygen and moisture that permeates the encapsulation film from the exterior. Accordingly, the quality and lifespan of the organic light emitting display device can be increased.

Although certain embodiments have been shown and described, it would be appreciated by those skilled in the art that changes might be made without departing from the principles and spirit of the disclosure, the scope of which is defined in the claims and their equivalents.

What is claimed is:

1. An organic light emitting display device, comprising:
   a substrate comprising a pixel region and a non-pixel region outside the pixel region;
   at least one organic light emitting diode disposed in the pixel region;
   an encapsulation film encapsulating the pixel region and the non-pixel region and comprising at least one organic film and at least one inorganic film,
   wherein the at least one organic film and the at least one inorganic film are alternately laminated together, wherein the encapsulation film is positioned so as to encapsulate the organic light emitting diode, wherein an area of the at least one organic film is smaller than an area of the at least one inorganic film and edges of an at least one inorganic film extend past edges of an at least one organic film, wherein the at least one inorganic film is an uppermost layer of the encapsulation film and contacts the substrate, and wherein the at least one organic film does not contact the substrate; and
   a desiccant disposed only on a peripheral edge portion of at least one of the at least one organic film and the at least one inorganic film in the non-pixel region of the substrate.

2. The organic light emitting display device of claim 1, wherein the desiccant is disposed in the at least one organic film.

3. The organic light emitting display device of claim 1, wherein the desiccant is disposed in the at least one inorganic film.

4. The organic light emitting display device of claim 1, wherein the desiccant is disposed between the at least one organic film and the at least one inorganic film.

5. The organic light emitting display device of claim 1, wherein the desiccant comprises at least one of alkali metal oxides, alkali earth metal oxides, metal halides, lithium sulfate, metal sulfates, metal perchlorates, and phosphorus pentoxide.

6. The organic light emitting display device of claim 1, wherein the encapsulation film comprises at least two layers of the at least one organic film and at least two layers of the at least one inorganic film laminated together.

7. The organic light emitting display device of claim 1, wherein a thickness of the encapsulation film is from about 0.5 µm to about 100 µm.

8. The organic light emitting display device of claim 1, wherein the organic film of the encapsulation film comprises at least one of epoxy, acrylate, and urethane acrylate.

9. The organic light emitting display device of claim 1, wherein the inorganic film of the encapsulation film comprises at least one of $SiN_x$, $SiO_2$, $SiO_xN_y$, $AlO_xN_y$, $Al_xO_y$, and $Si_xO_y$.

10. The organic light emitting display device of claim 1 further comprising a passivation film disposed between the substrate and the encapsulation film.

11. The organic light emitting display device of claim 10, wherein the desiccant is disposed between the passivation film and the encapsulation film.

12. The organic light emitting display device of claim 10, wherein the passivation film comprises an inorganic film.

13. The organic light emitting display device of claim 10, wherein the passivation film comprises at least one of an inorganic substance, LiF, $SiO_2$, $Al_2O_3$, an oxide, a nitride, and an organic substance.

* * * * *

UNITED STATES PATENT AND TRADEMARK OFFICE
CERTIFICATE OF CORRECTION

| | | |
|---|---|---|
| PATENT NO. | : 8,674,596 B2 | Page 1 of 1 |
| APPLICATION NO. | : 12/135951 | |
| DATED | : March 18, 2014 | |
| INVENTOR(S) | : Kim et al. | |

It is certified that error appears in the above-identified patent and that said Letters Patent is hereby corrected as shown below:

On the Title Page (item 74, Attorney) at line 1, Change "Martens." to --Martens,--.

In the Claims

In column 8 at line 29 (approx.), in Claim 7, change "100 μm." to --10 μm.--.

In column 8 at line 47, in Claim 13, change "$SiO_2$," to --$SiO_2$, $Si_xN_y$,--.

Signed and Sealed this
Twenty-third Day of September, 2014

Michelle K. Lee
*Deputy Director of the United States Patent and Trademark Office*